United States Patent
Lacaze et al.

(10) Patent No.: US 11,353,865 B2
(45) Date of Patent: Jun. 7, 2022

(54) COORDINATION OF MINING AND CONSTRUCTION VEHICLES VIA SCRIPTING CONTROL

(71) Applicant: ROBOTIC RESEARCH OPCO, LLC, Clarksburg, MD (US)

(72) Inventors: Alberto Daniel Lacaze, Potomac, MD (US); Karl Nicholas Murphy, Cocoa Beach, FL (US)

(73) Assignee: ROBOTIC RESEARCH OPCO, LLC, Clarksburg, MD (US)

( * ) Notice: Subject to any disclaimer, the term of this patent is extended or adjusted under 35 U.S.C. 154(b) by 158 days.

(21) Appl. No.: 16/679,512

(22) Filed: Nov. 11, 2019

(65) Prior Publication Data

US 2021/0141372 A1 May 13, 2021

Related U.S. Application Data

(60) Provisional application No. 62/760,283, filed on Nov. 13, 2018.

(51) Int. Cl.
*G05D 1/00* (2006.01)
*G06F 11/36* (2006.01)
(Continued)

(52) U.S. Cl.
CPC ......... *G05D 1/0027* (2013.01); *G05D 1/0033* (2013.01); *G06F 8/40* (2013.01);
(Continued)

(58) Field of Classification Search
CPC ............... G05D 1/0027; G05D 1/0033; G05D 2201/0202; G05D 2201/021;
(Continued)

(56) References Cited

U.S. PATENT DOCUMENTS

| 5,555,503 A | 9/1996 | Kyrtsos et al. |
| 6,044,312 A | 3/2000 | Sudo et al. |

(Continued)

FOREIGN PATENT DOCUMENTS

| CN | 106627456 A | 5/2017 |
| WO | 2017180430 A1 | 10/2017 |

*Primary Examiner* — Ramsey Refai
(74) *Attorney, Agent, or Firm* — RowanTree Law Group, PLLC; Frederick F. Rosenberger

(57) ABSTRACT

Mines and construction sites are pnme applications for automation. The invention is composed of a protocol that allows multiple machines to be coordinated from a single application. The invention provides what in classical control is called a coordination layer between the machines (4D-RCS). This coordination layer is currently provided by humans as machines only interact with each other in the physical world, but there is no infrastructure to have them coordinated from an autonomous control standpoint. The system described in the present invention is a coordinating mining or construction machinery that is comprised of two or more mining (or construction) equipment with sensors and actuators, a database of stored behavior and sensing capabilities for each machine, a scripting editor that can concatenate sensing and behavior blocks, a controller (centralized or at each machine) that can interpret the scripts and command the machines according to the script, and a communication infrastructure that allows the machines to communicate.

20 Claims, 3 Drawing Sheets

(51) Int. Cl.
 *G06F 8/40* (2018.01)
 *G06F 8/61* (2018.01)
 *G06F 16/17* (2019.01)

(52) U.S. Cl.
 CPC ............ *G06F 8/61* (2013.01); *G06F 11/3628* (2013.01); *G06F 16/1734* (2019.01); *G05D 2201/021* (2013.01); *G05D 2201/0202* (2013.01)

(58) Field of Classification Search
 CPC .......... G06F 16/1734; G06F 8/40; G06F 8/61; G06F 11/3628
 See application file for complete search history.

(56) References Cited

U.S. PATENT DOCUMENTS

| | | | |
|---|---|---|---|
| 6,341,372 B1* | 1/2002 | Datig | G06N 3/004 715/234 |
| 9,383,754 B2 | 7/2016 | Takeda | |
| 9,925,662 B1 | 3/2018 | Jules et al. | |
| 10,048,692 B2 | 8/2018 | Hamada et al. | |
| 10,071,893 B2 | 9/2018 | High et al. | |
| 10,802,503 B2 | 10/2020 | Minagawa et al. | |
| 2004/0158355 A1 | 8/2004 | Holmqvist et al. | |
| 2008/0021632 A1 | 1/2008 | Amano | |
| 2011/0029238 A1 | 2/2011 | Lee et al. | |
| 2012/0092486 A1 | 4/2012 | McDaniel et al. | |
| 2012/0136509 A1 | 5/2012 | Everett et al. | |
| 2012/0136524 A1 | 5/2012 | Everett et al. | |
| 2013/0173109 A1 | 7/2013 | Hukkeri et al. | |
| 2013/0325208 A1 | 12/2013 | Osagawa et al. | |
| 2015/0285650 A1 | 10/2015 | Lewis et al. | |
| 2016/0040397 A1 | 2/2016 | Kontz | |
| 2016/0271795 A1 | 9/2016 | Vicenti | |
| 2016/0314224 A1 | 10/2016 | Wei et al. | |
| 2016/0349754 A1 | 12/2016 | Mohr et al. | |
| 2016/0379152 A1 | 12/2016 | Rodoni | |
| 2017/0247033 A1 | 8/2017 | Vandapel | |
| 2017/0253237 A1 | 9/2017 | Diessner | |
| 2017/0314955 A1 | 11/2017 | Lynn | |
| 2017/0315515 A1 | 11/2017 | Vandapel et al. | |
| 2018/0004224 A1 | 1/2018 | Arndt et al. | |
| 2018/0044888 A1 | 2/2018 | Chi et al. | |
| 2019/0033877 A1 | 1/2019 | Wei | |
| 2019/0072953 A1 | 3/2019 | Maheshwari et al. | |
| 2019/0073762 A1 | 3/2019 | Kean | |
| 2019/0212745 A1 | 7/2019 | Wendt et al. | |
| 2019/0279508 A1 | 9/2019 | Wang | |
| 2019/0286148 A1 | 9/2019 | Hase et al. | |
| 2019/0302794 A1 | 10/2019 | Kean et al. | |
| 2020/0033847 A1* | 1/2020 | Way | G05D 1/0022 |
| 2020/0050192 A1* | 2/2020 | O'Donnell | G05D 1/0295 |
| 2020/0117201 A1 | 4/2020 | Oetken et al. | |
| 2020/0150656 A1 | 5/2020 | Lacaze et al. | |
| 2020/0150668 A1 | 5/2020 | Lacaze et al. | |
| 2020/0150687 A1 | 5/2020 | Halder et al. | |
| 2020/0174486 A1 | 6/2020 | Luo et al. | |
| 2020/0180924 A1 | 6/2020 | Lacaze et al. | |
| 2020/0225675 A1 | 7/2020 | Lacaze et al. | |
| 2020/0344622 A1* | 10/2020 | Campbell, Jr. | H04L 41/147 |
| 2020/0362541 A1 | 11/2020 | Takaoka | |
| 2020/0394813 A1 | 12/2020 | Theverapperuma et al. | |
| 2020/0401134 A1 | 12/2020 | Lacaze et al. | |
| 2021/0064050 A1 | 3/2021 | Pickett et al. | |
| 2021/0124359 A1 | 4/2021 | Wei | |

* cited by examiner

COORDINATION OF MINING AND CONSTRUCTION VEHICLES VIA SCRIPTING CONTROL

CROSS REFERENCE TO RELATED PATENT APPLICATIONS

The present application claims benefit of and priority under 35 U.S.C. § 119(e) to, and is a Non-provisional of U.S. Provisional Patent Application No. 62/760,283, filed Nov. 13, 2018, entitled "Self-Discovery Mechanism, Scripting Language, and Optimization for Mining and Construction Applications."

STATEMENT REGARDING FEDERAL SPONSORSHIP

No part of this invention was a result of any federally sponsored research.

TECHNICAL FIELD OF THE INVENTION

The present invention relates in general to autonomous systems, and, more specifically, to a self-discovery mechanism, scripting language and optimization for mining and construction applications.

COPYRIGHT AND TRADEMARK NOTICE

A portion of the disclosure of this patent application may contain material that is subject to copyright protection. The owner has no objection to the facsimile reproduction by anyone of the patent document or the patent disclosure, as it appears in the Patent and Trademark Office patent file or records, but otherwise reserves all copyrights whatsoever.

Certain marks referenced herein may be common law or registered trademarks of third parties affiliated or unaffiliated with the applicant or the assignee. Use of these marks is by way of example and should not be construed as descriptive or to limit the scope of this invention to material associated only with such marks.

BACKGROUND OF THE INVENTION

Mines and construction sites are prime applications for automation. The sites are relatively structured, and many of the applications cause accidents to operators from a variety of risks. However, relatively small amount of automation has been accomplished for some tasks in the mine. For example, lots of efforts have concentrated in excavators and self-driving trucks while other areas have been relatively ignored. Most of these attempts are either operator aids (most products currently available with excavators) and are designed to automate a single machine at a time. The reality of a mine or construction site is that there is a whole ecosystem of different specialized machinery that is specifically designed to perform particular tasks that are currently coordinated using human help. Although there are a number of large commercial vendors that provide a variety of machinery, it is common to have equipment from several manufacturers on a single site in particular for large operations where machine specialization is important to maximize efficiency. Autonomous coordination of machines from a single vendor are very limited and coordination between machines across different vendors is non-existent.

The invention is composed of a protocol that allows multiple machines to be coordinated from a single application. The invention is composed of a scripting language that allows the operator to select behaviors from each machine to create a cooperative behavior that can be implemented across different types of machines and different vendors. Part of the protocol includes a mechanism that allows each machine (even from different vendors) to provide a set of behavior and sensor blocks that the particular machine can perform. For example, an excavator equipped with a drive-by wire kit may have behavior blocks that allow it to move each of its actuators. A more sophisticated excavator may have behavior blocks that combine multiple actuators to create more complex maneuvers, for example, dig up a scoop of dirt. An even more sophisticated excavator may have a behavior block that allows it to automatically reposition avoiding obstacles, etc. These complex machines not only have behaviors, but they also have sensors. Simple sensors include pressures, temperature, etc. More advanced sensing behaviors may include the determination of dynamic flip areas, or pedestrian detection. These sensors or perception sensor combinations are also combined into sensor blocks. In order for our invention to work, the machine vendors need to agree to provide these blocks, or aftermarket wrappers that provide the blocks and execution capabilities are made available.

The invention provides what in classical control is called a coordination layer between the machines (4D-RCS). This coordination layer is currently provided by humans as machines only interact with each other in the physical world, but there is no infrastructure to have them coordinated from an autonomous control standpoint.

BRIEF SUMMARY OF THE INVENTION

To minimize the limitations in the prior art, and to minimize other limitations that will be apparent upon reading and understanding the present specification, the present invention describes a self-discovery mechanism, scripting language and optimization for mining and construction applications.

These and other advantages and features of the present invention are described herein with specificity so as to make the present invention understandable to one of ordinary skill in the art, both with respect to how to practice the present invention and how to make the present invention.

BRIEF DESCRIPTION OF THE SEVERAL VIEWS OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention.

DETAILED DESCRIPTION OF THE INVENTION

Figure 1:
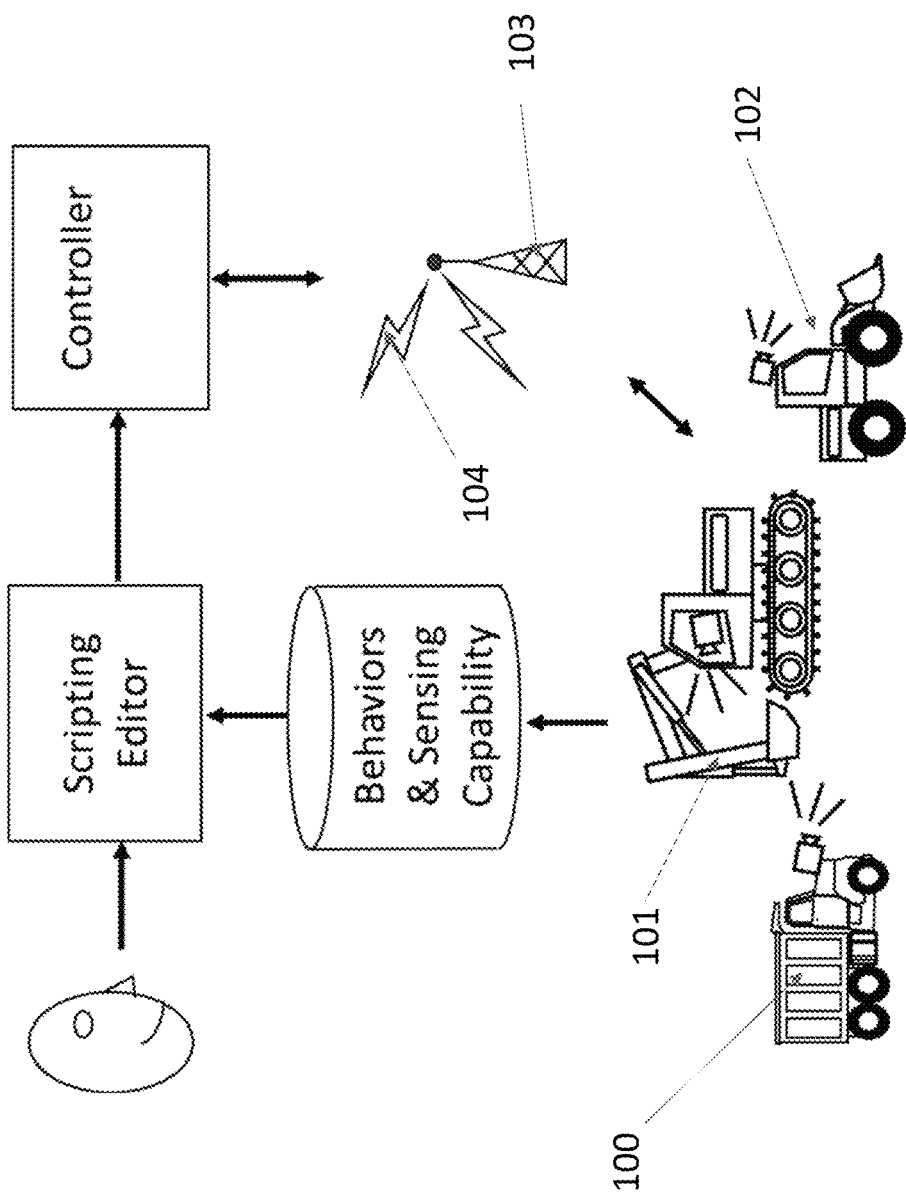
FIG. 1 shows a schematic of the basic system coordinating mining equipment.

The invention provides tools in different phases:

Mine Operation Equipment discovery. During this stage, a mine operator is deciding the flow of the mine (or construction site), the location of the areas where the machinery will reside, the types of machines and number of each machine used. During this phase, the invention will retrieve the behavior and sensing blocks from each machine in the repertoire of available machines for this mine/construction site. He/she is able to instantiate each machine and its behavior and sensing blocks inside the system. At that moment, he/she will have access to each of the behaviors and sensing blocks of each machine to start the scripting process. The invention has a graphical user interface that allows the mine planner to browse and edit the script for the created blocks. The behavior blocks have inputs and outputs. Inputs to a behavior block may be the desired position of that particular actuator. Outputs to a behavior block may be the status of the machine, or the progress on the particular behavior.

Mine flow planning. At this stage, the mine planner has decided the position of the machines, and the types and numbers of each piece of equipment, and an approximate geographic placement of each system. At this point he/she will start writing the scripts. The scripts are concatenations of behavior, sensing, and flow blocks that allow the planner to create more complex behavior. The scripting language is multithreaded in the sense that multiple machines can execute different behaviors blocks at the same time. Some behaviors in the same machine are also multithreaded in the sense that a machine may be able to execute two different blocks at the same time. A simple example of this is a behavior block and a sensing block executed in parallel. The scripts may also include human interaction. Humans can carry OCUs (Operator Control Units) with programmable inputs that have their own sensing and behavior blocks. The behavior blocks for some vehicles can be pre-programmed by the vendors or they can be learned by operating the machinery (either directly or through teleoperation). The scripts can be built hierarchically by abstracting parts of the scripts. The operator can script both behavior and sensing blocks. At this end of this process, the system has a set of scripts that coordinate the different machines around the mine.

Simulation. The invention has a set of simulators that simulate each of the behavior and sensor bocks. As the invention is utilized by more companies, we expect that they will provide simulation modules for each of the blocks that they provide. In the preferred incarnation, these simulators are relatively simple in the sense that they estimate time of execution, fuel consumption, etc. without actually simulating the physical interactions. A more thorough implementation may include more physics related simulations of the machine soil interaction.

Optimization. Some of the behavior blocks provide ranges of parameters to allow for optimization. For example, a behavior block for a truck may specify the trajectory from a starting location to an ending location, and it may specify a range of speeds: 5-10 mph. These are hooks for the optimization system to perform its tasks. The optimization tool uses these ranges to optimize the cost function provided by the mine planner. The mine optimization function can include a variety of dimensions: fuel usage, time, ore throughput at location 1, product throughput at location 2, probability of errors or damage to equipment, wear and tear, etc. The optimization tool uses the simulator and a multivariate optimization technique to optimize the parameters that have been exposed to optimization. The preferred tool for optimization is implemented using genetic algorithms, but other implementations of the invention may include simplex or other optimal or non-optimal optimization techniques. The optimization is first run against the stock simulators results, and then the simulators are enhanced with data collected during the execution time. In the truck case, the 5 mph speed may be optimal in the sense that faster speeds will use more fuel, if the loader will not be able to load the trucks faster and therefore, the trucks will sit idle for longer periods of time. On the contrary, 10 mph could be optimal if the loader is sitting idle for longer periods of time.

Execution. During the execution phase, the master script is separated into sub-scripts relevant to each system. This is performed by downloading the selected blocks to each machine (or optionally running the scripts to each machine over the radio). The precedence as well as other synchronizing sensor outputs are shared across the infrastructure with other machines in the family of systems. So, for example, the bucket loader may have an action block to drop a load on the truck, however, the truck needs to be docked before the load can be dropped. The bucket loader behavior block and parameters selected by the operator are downloaded to the bucket loader, however, the bucket loader will not be allowed to execute it until it receives a signal from the truck stating that the status of its docking behavior module is completed. The execution requires that the machines share a communication network and that they implement the state machine executor that uses signals relayed from the network.

Parametric Learning. As the different blocks are executed, their execution time, and other parameters relevant to the performance are collected. These parameters are fed back into the simulation to further improve the optimization. For example, the simulation showed that the trucks moving at 10 mph consumed 120 gallons of diesel over the day of operations, however, the simulation expected that they will only consume 110. Parametrized learning is used to recalibrate the simulation results. The multivariate optimization is run after the parametric adjustments have been completed.

The scripting language allows the mine operators to assemble and compose new autonomous vehicle behavior.

The scripting language in the invention is a graphical user interface where blocks in the display represent the elementary behavior upon which more complex behavior is built upon.

In particular, the scripting language has behavior blocks, sensing blocks, and logic blocks. Some of the blocks can be learned. For example, the operator may choose to record a trajectory. This trajectory becomes a behavior block. Now, the operator can link two or more of these behaviors to create a more complex behavior. For example, the 3 behaviors presented in the previous subsections are behavior blocks that can be scripted as part of a larger more complex behavior. The sensor blocks allow the operator to concatenate behavior until a particular sensor (or combination of sensors) achieve a certain value. For example, let's say that the mine operator would like to create a new unloading behavior. He/she can take a behavior block that encapsulates the motion of the truck to the unloading area, then he can use the behavior block "Dumping in area". That behavior will generate a trajectory for the truck to the next needed load. Then, the operator can add a behavior to route from the dumping area to the begging of the mine road. Finally, the operator can concatenate another behavior block that has the truck take the mine road back to the loading area. The scripting language in the invention is hierarchical in the sense that more complex behavior can be encapsulated by using simpler blocks. The preferred embodiment of the invention uses a visual language as it is simpler to understand by the mining operators, but, other embodiments may have other scripting language that are not visual and use text to describe the sequences of actions.

While the invention has been described in connection with what is presently considered to be the most practical and preferred embodiments, it is to be understood that the invention is not to be limited to the disclosed embodiments, but, on the contrary, is intended to cover various modifications and equivalent arrangements included within the spirit and scope of the appended claims. Note with respect to the materials of construction, it is not desired nor intended to thereby unnecessarily limit the present invention by reason of such disclosure.

FIG. 1 illustrates a basic system for coordinating mining equipment. Unmanned mining equipment with sensors and actuators have known behaviors and sensing capabilities. These are stored in a database that can be centralized or distributed. A human uses a scripting editor to specify combined sensing and resulting behaviors for individual machines and combined sensing and behaviors for coordinated actions among the machines. A controller interprets the scripts and commands the individual machines. The controller may be centralized, or it may be distributed. A communication infrastructure provides connectivity. In FIG. 1, it can be seen that there are three different types of construction and mining equipment (100, 101, and 102) that are shown. The information from the controller is passed onto a control tower (103) via communication signals (104).

Figure 2:
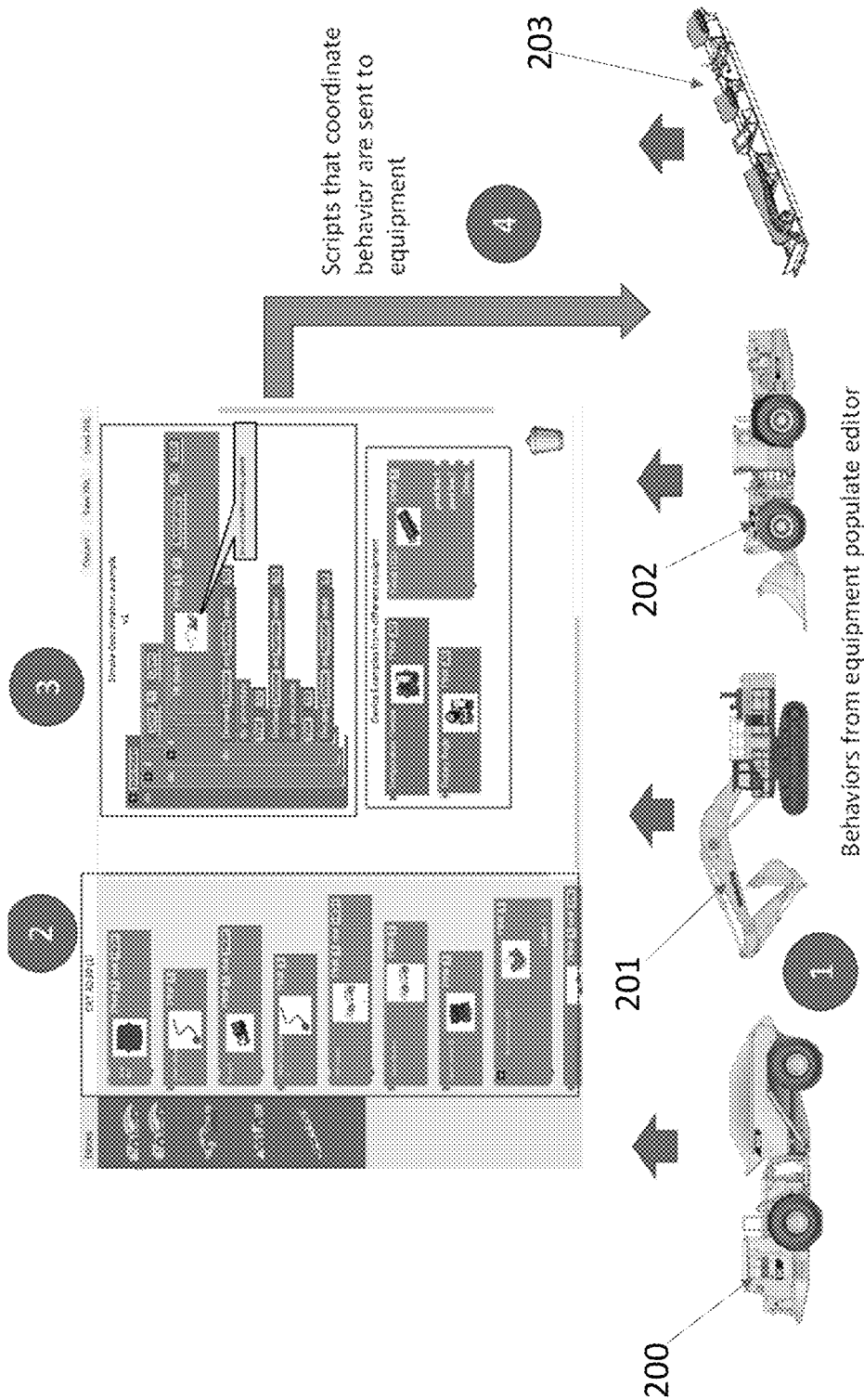
FIG. 2 illustrates the script editor.

FIG. 2 illustrates the script editor in which the available machines (1) have known basic behaviors and sensing capabilities that are displayed on the script editor (2). The operator edits a script to combine these behaviors (3). The script specifies what behaviors are triggered when given events are sensed and/or when other machines have completed certain behaviors of their own. The script can be hierarchical where some scripts are behaviors defined in sub-scripts. The script is sent to the machines (4) resulting in the desired coordinated actions. Several different types of construction and mining related equipment (200, 201, 202, and 203) are illustrated in FIG. 2.

Figure 3:
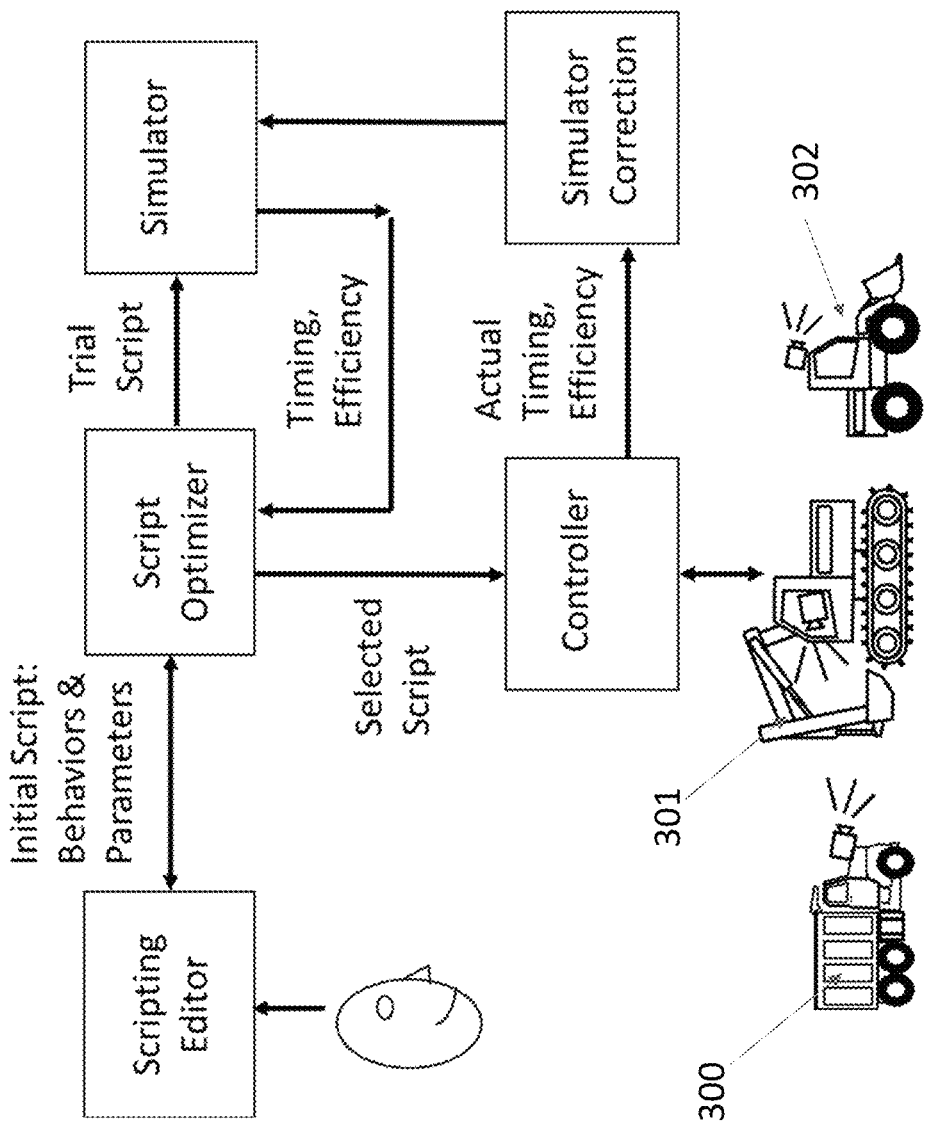
FIG. 3 illustrates the process of script optimization.

FIG. 3 illustrates the process of script optimization. Here, a simulator can be used to simulate a trial script to estimate its performance, timing, efficiency, etc. Additionally, a script optimizer can be used to improve the script. Different parameters such as speed, location, and timing as well as different behaviors can be computed and sent to the simulator. The best script is selected and sent to the controller. Actual performance of the real system can be used to correct the simulator so that the simulator's results more accurately predict the real system. The script can be further optimized using the updated simulator. FIG. 3 shows three different types of construction and mining equipment (300, 301, and 302).

The present invention describes a system for coordinating mining or construction machinery comprising two or more mining or construction equipment with sensors and actuators, a database of stored behavior and sensing capabilities for each machine, a scripting editor that can concatenate sensing and behavior blocks, a controller (centralized or at each machine) that can interpret the scripts and command the machines according to the script, and a communication infrastructure that allows the machines to communicate.

The system described in the present invention has a script that is capable of simulating the scripts. The script editor can predict the timing outcomes of the script that has been created.

In the system that is disclosed in the present invention, the behavior blocks are assigned ranges of values rather than the exact values. In this system, the optimizer is used to adjust the parameters in the behavior blocks to optimize for time, throughput, overall cost, fuel, wear, safety, or a combination of either of these.

In the system that is described in the present invention, the simulator is further improved with measurements from execution. In this system, the script editor is either visual or text.

In the system described in the present invention, the operators carry operator control units that can also provide behavior and sensing blocks. One example is the position of the operator. In this system, the simulator used FEA (finite element analysis) to compute the timing requirements.

Finite element analysis (FEA) refers to a numerical method for solving problems of engineering and mathematical physics. Typical problem areas of interest include structural analysis, heat transfer, fluid flow, mass transport, and electromagnetic potential.

In this system described in the present invention, the scripting editor already has a set of maneuvers to perform particular motions, loading, dumping, etc. Here the behavior blocks of each machine are recorded by driving the vehicle or teleoperating the vehicle.

In this system described by the present invention, the editor and simulator provide the mining o-operator a real time "debugging" function that allows the operator to know the block being executed by each machine.

In this system, the scripting language can multitask and can be organized hierarchically. In this system, the executor logs all the information sent through the network. Some of the machines are simulated and some are not simulated in order to partially test the scripts.

In the system that is disclosed in the present invention, the system is further enhanced with encryption and authentication between the computers containing the scripts and the ones executing the scripts.

In the system that is described in the present invention, some of the equipment is human driven and does not have behavior modules, but it does have sensor blocks such as those for providing their position to be used by the script.

In the system that is described in the present invention, multiple cycles of optimization and real time data logging are performed.

In the system that is disclosed in the current invention, it is used to plan operations at a new sight and different equipment is simulated to determine what is the optimal mix of machine types and quantity over time.

We claim:

1. A system with coordination between different mining or construction machinery, the system comprising:
   two or more autonomous mining or construction (M/C) machines, each M/C machine comprising:
      a plurality of actuators;
      a drive-by-wire kit operatively coupled to the plurality of actuators and configured to control one or more the actuators in performing an M/C function;
      a plurality of sensors mounted on the M/C machine and configured to detect features in an environment surrounding the M/C machine, operation or movement of the M/C machine, or any combination of the foregoing; and
      a first communication device;
   a database storing a plurality of blocks for each M/C machine, the stored blocks comprising sensing blocks and behavior blocks, each behavior block corresponding to operation of one or more actuators in a respective one of the M/C machines, each sensing block corresponding to detection performed by one or more sensors in a respective one of the M/C machines;
a second communication device; and
a controller operatively coupled to the database and the second communication device,
wherein the controller is operable to execute stored instructions to:
(i) receive, via a user interface, a selection by an operator of first and second stored blocks defining performance of a first M/C function and/or sensing by a first of the M/C machines;
(ii) receive, via the user interface, a selection by the operator of third and fourth stored blocks defining performance of a second M/C function and/or sensing by a second of the M/C machines;
(iii) assemble the first and second stored blocks to form a first operation script for the first of the M/C machines;
(iv) assemble the third and fourth stored blocks to form a second operation script for the second of the M/C machines;
(v) send, via the second communication device to the respective first communication device, the first and the second operation scripts to the first and second of the M/C machines, respectively; and
(vi) control, via the respective drive-by-wire kit, the first and second of the M/C machines to perform the first and second operation scripts, respectively.

2. The system of claim 1, wherein the controller is further operable to execute stored instructions to, prior to (v):
simulate operations of the first and second of the M/C machines in performing the first and second operation scripts; and
display, via the user interface, the simulated operations.

3. The system of claim 2, wherein, in simulating the operations, the controller is operable to predict a timing of operations of the first and second of the M/C machines in performing the first and second operation scripts.

4. The system of claim 1, wherein one or more of the behavior blocks comprises a range of values for operation of the corresponding one or more actuators.

5. The system of claim 1, wherein the controller is further operable to execute stored instruction to, prior to (v):
(vi) simulate operations of the first and second of M/C machines in performing the first and second operation scripts;
(vii) adjust, in a behavior block of a least one of the first and second operation scripts, at least one M/C machine parameter; and
(viii) optimize for time, throughput, overall cost, fuel, wear, safety, or any combination of the foregoing by repeating (vi) and (vii).

6. The system of claim 5, wherein the controller is further operable to employ measurements from prior execution of the first and second operation scripts in (vi).

7. The system of claim 1, further comprising:
an operator control unit (OCU) constructed to be carried by a human, the OCU comprising one or more sensors and a third communication device,
wherein the database further stores behavior and sensing blocks for the OCU, each behavior block corresponding to an operation to be performed by the human, each sensing block corresponding to detection performed by one or more sensors of the OCU.

8. The system of claim 3, wherein the simulator used controller is further operable to employ finite element analysis (FEA) to predict compute the timing.

9. The system of claim 1, wherein the database stores at least one predetermined operation script for performing of an M/C function, the predetermined operation script comprising at least two behavior blocks.

10. The system of claim 1, wherein:
the first of the M/C machines further comprises a local control module operatively coupled to plurality of actuators and the plurality of sensors, the local control module being configured to:
monitor the actuators and/or sensors as the first of the M/C machines is operated by a human; and
determine, based on the monitoring, a learned behavior block, a learned sensor block, or both, and
the plurality of blocks stored by the database comprises the learned behavior block, the learned sensor block, or both.

11. The system of claim 1, wherein the controller is further operable to execute stored instructions to display, to the operator via the user interface, an indication of a block of the first or second operation script being executed by the respective M/C machine.

12. The system of claim 1, wherein performance of at least one of the first and second operation scripts is multi-task, or blocks in at least one of the first and second operation scripts are organized hierarchically.

13. The system of claim 1, wherein the controller is further operable to execute stored instructions to log all information sent to the M/C machines.

14. The system of claim 1, wherein the controller is further operable to execute stored instructions to, prior to (v):
receive an operation script from a different installation; and
merge the operation script from the different installation with at least one of the first and second operation scripts.

15. The system of claim 1, wherein the controller is further operable to employ encryption and authentication in the sending of (v).

16. The system of claim 1, further comprising:
a human-operated M/C machine comprising a plurality of sensors and a third communication device configured to communicate with the first communication devices of the two or more M/C machines, with the second communication device of the controller, or both,
wherein the database further stores one or more sensor blocks corresponding to detection performed by one or more sensors of the human-operated M/C machine.

17. The system of claim 6, wherein the controller is further operable to execute stored instructions to perform multiple cycles of optimization and real time data logging.

18. The system of claim 5, wherein the optimization of (viii) employs a genetic algorithm or a simplex optimization technique.

19. The system of claim 1, wherein:
the two or more autonomous M/C machines comprise an excavator, a dump truck, or a loader; and
in performing the first and second operation scripts, the first and second of the M/C machines interact with each other.

20. The system of claim 1, wherein:
the second operation script comprises a first sensing block for the second of the M/C machines; and
the first operation script comprises a logic block that delays performance of at least a portion of the first operation script by the first of the M/C machines until receipt of a signal corresponding to the first sensing block from the second of the M/C machines.

\* \* \* \* \*